(12) United States Patent
Itai et al.

(10) Patent No.: US 12,376,269 B2
(45) Date of Patent: Jul. 29, 2025

(54) POWER CONVERSION DEVICE

(71) Applicant: HONDA MOTOR CO., LTD., Tokyo (JP)

(72) Inventors: Keisuke Itai, Wako (JP); Noriaki Okamoto, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 226 days.

(21) Appl. No.: 18/113,081

(22) Filed: Feb. 23, 2023

(65) Prior Publication Data

US 2023/0309279 A1     Sep. 28, 2023

(30) Foreign Application Priority Data

Mar. 25, 2022  (JP) ................................. 2022-050524

(51) Int. Cl.
| | | |
|---|---|---|
| H05K 7/20 | (2006.01) | |
| H02M 1/08 | (2006.01) | |
| H02M 3/00 | (2006.01) | |
| H02M 3/158 | (2006.01) | |

(52) U.S. Cl.
CPC .......... *H05K 7/20927* (2013.01); *H02M 1/08* (2013.01); *H02M 3/003* (2021.05); *H02M 3/158* (2013.01)

(58) Field of Classification Search
CPC .... H05K 7/20927; H02M 3/003; H02M 1/08; H02M 3/158; H02M 7/003
See application file for complete search history.

(56) References Cited

U.S. PATENT DOCUMENTS

| | | | | |
|---|---|---|---|---|
| 5,517,063 | A | * | 5/1996 | Schantz, Jr. .............. B60L 3/00 363/71 |
| 6,650,559 | B1 | * | 11/2003 | Okamoto .............. H01L 25/162 363/141 |
| 10,411,589 | B2 | * | 9/2019 | Nakashima ........... H02M 7/003 |

(Continued)

FOREIGN PATENT DOCUMENTS

| | | |
|---|---|---|
| JP | 2010-233294 | 10/2010 |
| JP | 2016-220344 | 12/2016 |

(Continued)

OTHER PUBLICATIONS

Japanese Notice of Allowance for Japanese Patent Application No. 2022-050524 dated Jan. 30, 2024.

*Primary Examiner* — Jayprakash N Gandhi
*Assistant Examiner* — Jeffrey Francis Stoll
(74) *Attorney, Agent, or Firm* — Amin, Turocy & Watson, LLP

(57) ABSTRACT

A power conversion device includes an element module, a condenser, a case, a cooler, a positive terminal and a negative terminal on a primary side, and a positive terminal and a negative terminal on a secondary side. The case accommodates the element module, the condenser, and the case. The element module and the condenser are disposed on a surface side of the cooler. The power conversion device includes a secondary side positive electrode bus bar and a secondary side negative electrode bus bar that are connected between the positive terminal and negative terminal on the secondary side and the condenser. The secondary side positive electrode bus bar and the secondary side negative electrode bus bar are arranged on the surface side of the cooler.

7 Claims, 5 Drawing Sheets

(56) References Cited

U.S. PATENT DOCUMENTS

| | | | | |
|---|---|---|---|---|
| 2009/0009980 | A1* | 1/2009 | Ward | H02M 7/003 |
| | | | | 361/748 |
| 2011/0194246 | A1* | 8/2011 | Nakasaka | H05K 7/20927 |
| | | | | 361/688 |
| 2015/0208556 | A1* | 7/2015 | Kodama | B60L 53/22 |
| | | | | 363/141 |
| 2018/0174934 | A1* | 6/2018 | Tani | H02M 7/003 |
| 2018/0309388 | A1 | 10/2018 | Jones et al. | |
| 2019/0159367 | A1* | 5/2019 | Umino | H01L 23/34 |
| 2019/0245433 | A1* | 8/2019 | Yan | H05K 7/1427 |
| 2019/0348907 | A1* | 11/2019 | Yamaura | H02M 7/003 |
| 2019/0356235 | A1* | 11/2019 | Shindo | B60L 15/2045 |
| 2019/0357392 | A1* | 11/2019 | Ikeda | H01G 2/08 |
| 2021/0144888 | A1* | 5/2021 | Sano | H05K 7/20927 |

FOREIGN PATENT DOCUMENTS

| | | |
|---|---|---|
| JP | 2019-201527 | 11/2019 |
| JP | 2020-174499 | 10/2020 |

* cited by examiner

POWER CONVERSION DEVICE

CROSS-REFERENCE TO RELATED APPLICATION

Priority is claimed on Japanese Patent Application No. 2022-050524, filed on Mar. 25, 2022, the contents of which are incorporated herein by reference.

BACKGROUND

Field of the Invention

The present invention relates to a power conversion device.

Background

Conventionally, for example, a power conversion device that includes a semiconductor module and a condenser disposed to sandwich a cooler from both sides in a thickness direction is known (refer to, for example, Japanese Unexamined Patent Application, First Publication No. 2019-201527). The power conversion device includes a bus bar provided across the cooler for connecting the semiconductor module and the condenser.

SUMMARY

As in the conventional power conversion device described above, when the semiconductor module and the condenser are disposed on both sides of the cooler in the thickness direction, as the thickness of the entire device increases, there arises a problem that it is difficult to arrange the bus bar efficiently. Moreover, it is difficult to reduce the length of the bus bar that connects the semiconductor module and the condenser, and there arises a problem that it is difficult to prevent an increase in a parasitic inductance.

An object of an aspect of the present invention is to provide a power conversion device capable of improving layout efficiency of the configuration or improving electrical energy efficiency.

A power conversion device according to a first aspect of the present invention includes: a switching element; a condenser connected to the switching element; and a cooler configured to cool at least one of the switching element and the condenser, the power conversion device including: a case configured to accommodate the switching element and the condenser; a plurality of terminals for power input and output that are provided on the case; and a conductive member connected between a predetermined terminal of the plurality of terminals and the condenser, wherein the switching element and the condenser are disposed on a first surface side of the cooler, and the conductive member is disposed on a second surface side of the cooler.

A second aspect is the power conversion device described in the first aspect, wherein the plurality of terminals may include a first terminal and a second terminal, and in a plan view seen from a first predetermined direction of the case, the first terminal may be disposed on a portion of the case at a first direction side in a second predetermined direction, the second terminal which is the predetermined terminal may be disposed on a portion of the case at a second direction side in the second predetermined direction, and the condenser may be disposed on the first direction side of the switching element in the second predetermined direction.

A third aspect is the power conversion device described in the first or second aspect, wherein the conductive member may include a positive electrode conductive member and a negative electrode conductive member, and in a plan view seen from a predetermined direction of the case, the positive electrode conductive member and the negative electrode conductive member may be disposed so as to extend toward the predetermined terminal without overlapping each other at the second surface side of the cooler.

A fourth aspect is the power conversion device described in any one of the first to third aspects which may include a fastening member configured to fasten and fix at least one of the condenser and a module having the switching element, and the cooler together.

A fifth aspect is the power conversion device described in any one of the first to fourth aspects which may include: a controller configured to control an operation of the switching element; and a fastening member configured to fasten and fix the controller and the cooler together while providing a space by which at least one of the condenser and a module having the switching element is arranged between the controller and the cooler.

A sixth aspect is the power conversion device described in any one of the first to fifth aspects, wherein in a plan view seen from a predetermined direction of the case, a flow direction of a coolant flowing through a flow path formed in the cooler may have a direction that intersects a direction in which the switching element and the condenser are aligned.

According to the first aspect, it is possible to prevent lengthening of the connection between the switching element and the condenser and to prevent an increase in parasitic inductance by providing the switching element and the condenser disposed on the first surface side of the cooler. Due to the conductive member connected between the predetermined terminal for power input and output and the condenser being disposed on the second surface side of the cooler, the switching element, the condenser, and the conductive member can be efficiently disposed with respect to the cooler, for example, compared to a case in which the conductive member is disposed on the first surface side of the cooler.

In the case of the second aspect, due to at least one of the positive electrode and the negative electrode of the condenser being connected to the first terminal and the second terminal for power input and output, lengthening of the connection between the condenser and the first terminal can be prevented, and lengthening of a current path between the condenser and the first and second terminals through which a relatively large current flows can be prevented.

In the case of the third aspect, since the positive electrode conductive member and the negative electrode conductive member do not overlap each other when seen from a predetermined direction of the case, for example, compared to a case in which the positive electrode conductive member and the negative electrode conductive member overlap each other, it is possible to prevent an increase in the thickness of the entire device in the predetermined direction.

In the case of the fourth aspect, the module, the condenser, and the cooler can be fixed to the case by so-called jointly fastening, and the module, the condenser, and the cooler can be disposed efficiently compared to a case in which they are individually fixed with fastening members.

In the case of the fifth aspect, the controller and cooler can be fixed to the case by so-called jointly fastening, and the controller and the cooler can be disposed efficiently compared to a case in which they are individually fixed with fastening members. Moreover, a space for arranging at least one of the module and the condenser can be secured between the controller and the cooler, and arrangement efficiency of the entire device can be improved.

In the case of the sixth aspect, the switching element and the condenser can be cooled in series by the coolant flowing in a direction that intersects the direction in which the switching element and the condenser are aligned, and it is possible to efficiently provide a flow path for the coolant and to perform cooling efficiently with settings corresponding to each of the switching element and the condenser.

DESCRIPTION OF EMBODIMENTS

A power conversion device 10 according to an embodiment of the present invention will be described below with reference to the accompanying drawings.

<Vehicle>

Figure 1:
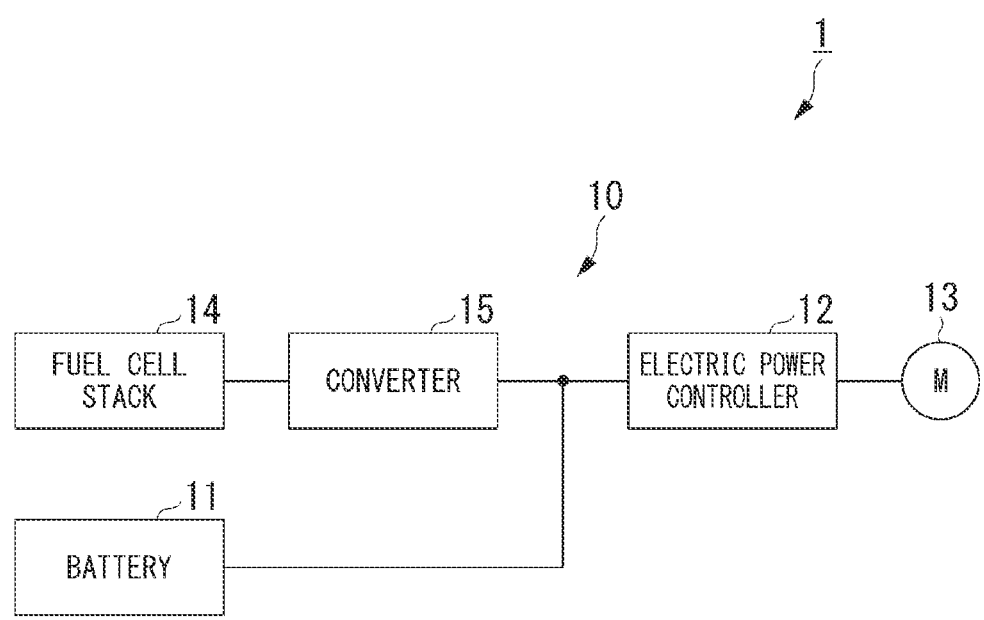
FIG. 1 is a block diagram showing part of a functional configuration of a vehicle equipped with a power conversion device according to an embodiment of the present invention.

FIG. 1 is a block diagram showing a part of a functional configuration of a vehicle 1 equipped with the power conversion device 10 according to the embodiment.

The power conversion device 10 of the embodiment is mounted in a vehicle 1 such as an electric motor vehicle. The electric motor vehicle includes, for example, an electric vehicle, a hybrid vehicle, a fuel cell vehicle, and the like. The electric vehicle is driven by a battery as a power source. The hybrid vehicle is driven by a battery and an internal combustion engine as power sources. The fuel cell vehicle is driven by a fuel cell as a power source.

As shown in FIG. 1, for example, the vehicle 1 is a fuel cell vehicle. The vehicle 1 includes a battery 11, an electric power controller 12, a rotating electric machine 13, a fuel cell stack 14, and a converter 15. The power conversion device 10 of the embodiment includes the converter 15, for example.

The battery 11 is, for example, a high-voltage battery that is a power source of the vehicle 1. The battery 11 includes a battery case and a plurality of battery modules accommodated in the battery case. Each of the battery modules includes a plurality of battery cells connected in series or in parallel. A positive terminal and a negative terminal of the battery 11 are connected to the electric power controller 12 and the converter 15 which will be described below.

The electric power controller 12 includes, for example, an inverter or the like that performs power conversion between direct current and alternating current. The electric power controller 12 includes, for example, a bridge circuit formed by a plurality of switching elements and rectifying elements that are bridge-connected in three phases. The electric power controller 12 controls an operation of the rotating electric machine 13 by transmitting and receiving electric power.

For example, when the rotating electric machine 13 is powered, the electric power controller 12 converts DC power input from the positive terminal and the negative terminal into three-phase AC power, and supplies the three-phase AC power to the rotating electric machine 13 from a three-phase AC terminal. The electric power controller 12 generates a rotational driving force by sequentially commutating energization of three-phase stator windings of the rotating electric machine 13.

For example, during regeneration of the rotating electric machine 13, the electric power controller 12 converts three-phase AC power input from the three-phase AC terminal into DC power by turning on (allowing conduction) and off (interrupting) the switching elements of each phase synchronized with the rotation of the rotating electric machine 13. The electric power controller 12 can supply the DC power converted from the three-phase AC power to battery 11.

Figure 2:
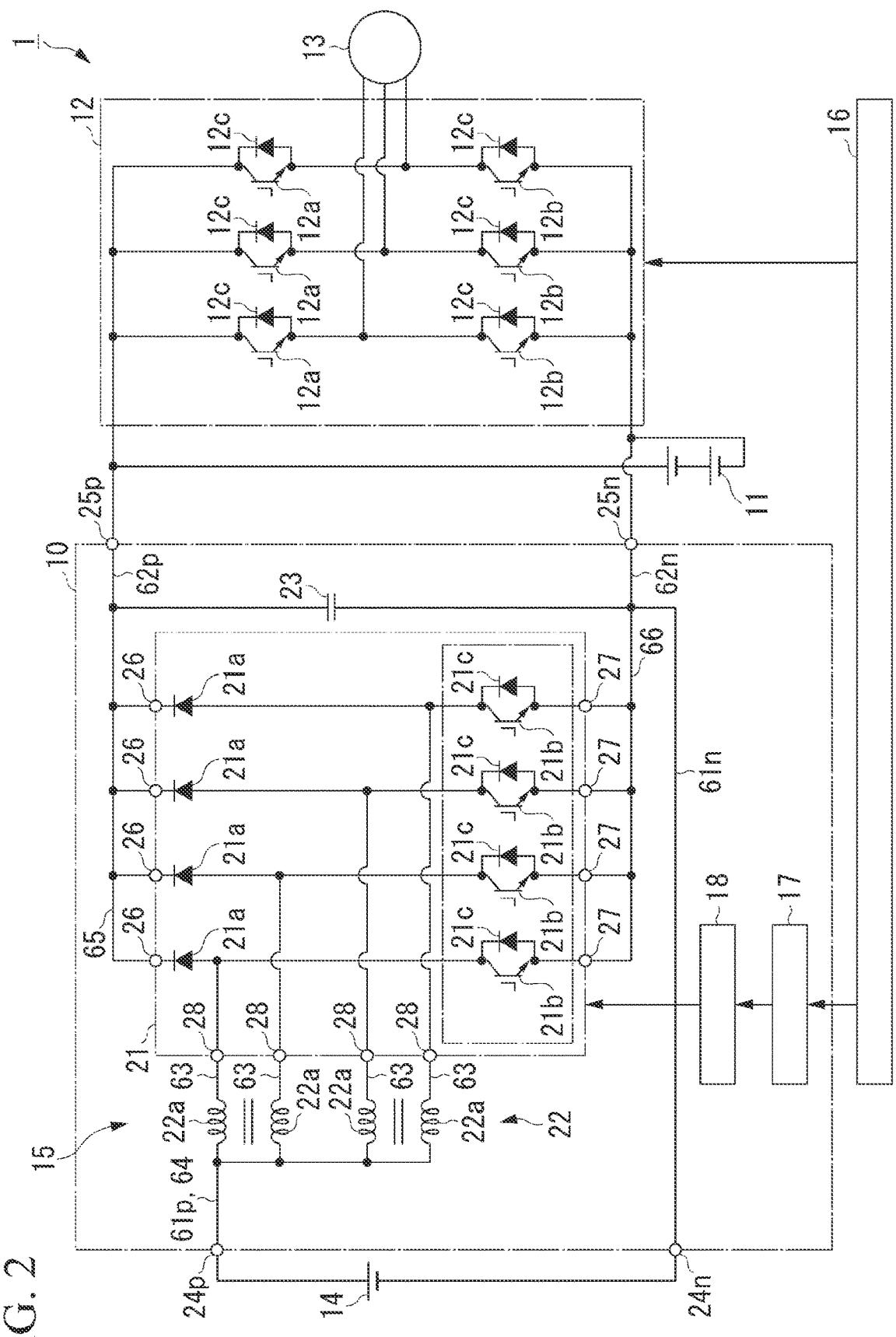
FIG. 2 is a diagram showing part of a configuration of the vehicle equipped with the power conversion device according to the embodiment of the present invention.

FIG. 2 is a diagram showing a part of the configuration of the vehicle 1 equipped with the power conversion device 10 according to the embodiment. As shown in FIG. 2, the switching element of the electric power controller 12 is, for example, a transistor such as an insulated gate bipolar transistor (IGBT) or a metal oxide semiconductor field effect transistor (MOSFET). A plurality of switching elements bridge-connected in three phases are high side arm and low side arm transistors 12a and 12b paired in each phase. A collector of the high side arm transistor 12a is connected to the positive terminal. An emitter of the low side arm transistor 12b is connected to the negative terminal. An emitter of the high side arm transistor 12a and a collector of the low side arm transistor 12b are connected to an AC terminal. The rectifying element of the electric power controller 12 is, for example, a reflux diode 12c connected in parallel in a forward direction from the emitter to the collector between the collectors and emitters of the transistors 12a and 12b.

The electric power controller 12 switches between turning-on (allowing conduction) and turning-off (interrupting) of the transistor pairs of each phase based on gate signals which are switching commands input from a control device 16 mounted in the vehicle 1 to gates of the transistors 12a and 12b.

The rotating electric machine 13 is, for example, a three-phase AC brushless DC motor. The rotating electric machine 13 includes a rotor having a permanent magnet for a magnetic field, and a stator having three-phase stator windings which generate a rotating magnetic field that rotates the rotor. The three-phase stator windings are connected to the AC terminal of the electric power controller 12.

The rotating electric machine 13 is for driving the vehicle 1, for example, and generates a rotational driving force by performing a power running operation with electric power supplied from the electric power controller 12. For example, when the rotating electric machine 13 can be connected to wheels of the vehicle 1, the rotating electric machine 13 generates a driving force by performing a power running operation with electric power supplied from the electric power controller 12. The rotating electric machine 13 may generate electric power by performing a regenerative operation with rotational power input from the wheel side of the vehicle 1. When the rotating electric machine 13 can be connected to an internal combustion engine of the vehicle 1, it may generate electric power using power of the internal combustion engine.

The fuel cell stack 14 is, for example, a solid polymer fuel cell. The solid polymer fuel cell includes a plurality of stacked fuel cells and a pair of end plates that sandwich a stack of the plurality of fuel cells. Each of the fuel cell includes an electrolyte electrode structure and a pair of separators that sandwich the electrolyte electrode structure. The electrolyte electrode structure includes a solid polymer electrolyte membrane, and a fuel electrode and an oxygen electrode that sandwich the solid polymer electrolyte membrane. The solid polymer electrolyte membrane includes a cation exchange membrane and the like. The fuel electrode (an anode) includes an anode catalyst, a gas diffusion layer, and the like.

The oxygen electrode (a cathode) includes a cathode catalyst, a gas diffusion layer, and the like.

The fuel cell stack 14 generates electric power through a reaction between a fuel gas supplied from a fuel tank to the anode and an oxidant gas such as oxygen-containing air supplied from an air pump to the cathode.

A positive terminal and a negative terminal of the fuel cell stack 14 are connected to the converter 15 which will be described below.

<Power Conversion Device>

As shown in FIG. 2, the power conversion device 10 of the embodiment includes the converter 15, an electronic control unit 17 (a controller), and a gate drive unit 18 (a controller).

The converter 15 includes, for example, a DC-DC converter that performs power conversion such as boosting. The converter 15 includes, for example, an element module 21 (a module) formed by a plurality of switching elements that are bridge-connected in four phases and rectifying elements, two composite reactors 22, and a condenser (a capacitor) 23. The converter 15 boosts power input from the fuel cell stack 14 to a positive terminal 24p (a terminal, a first terminal) and a negative terminal 24n (a terminal, a first terminal) on the primary side, and outputs the boosted power from a positive terminal 25p (a terminal, a predetermined terminal, a second terminal) and a negative terminal 25n (a terminal, a predetermined terminal, a second terminal) on the secondary side.

Each phase of the element module 21 of the converter 15 includes, for example, a high side arm diode 21a, a low side arm transistor 21b (a switching element), and a reflux diode 21c. A cathode of the high side arm diode 21a is connected to the positive terminal 25p on the secondary side via a first terminal 26, and a positive electrode bus bar 65 and a secondary side positive electrode bus bar 62p (a conductive member, a positive electrode conductive member) which will be described below. An emitter of the low side arm transistor 21b is connected to the negative terminal 24n on the primary side and the negative terminal 25n on the secondary side via a second terminal 27, and a negative electrode bus bar 66, a primary side negative electrode bus bar 61n, and a secondary side negative electrode bus bar 62n (a conductive member, a negative electrode conductive member) which will be described below. An anode of the high side arm diode 21a and a collector of the low side arm transistor 21b are connected. The low side arm reflux diode 21c is connected in parallel in the forward direction from the emitter to the collector between the collector and the emitter of the transistor 21b.

The composite reactor 22 includes, for example, two-phase coils 22a that are magnetically coupled with opposite polarities. A first end of each phase coil 22a is connected to the positive terminal 24p on the primary side via a primary side positive electrode bus bar 61p and a first bus bar 63 which will be described below. A second end of each phase coil 22a is connected to the anode of the high side arm diode 21a and the collector of the low side arm transistor 21b for each phase of the element module 21 via a third terminal 28, and a first bus bar 63 which will be described below.

The condenser 23 is, for example, a capacitor that smooths a voltage fluctuation that occurs as a result of a switching operation between turning-on (allowing conduction) and turning-off (interrupting) of each of the transistors 21b. The positive terminal and the negative terminal of the condenser 23 are respectively connected to the positive terminal 25p and the negative terminal 25n on the secondary side via the positive electrode bus bars 62p and 65 and the negative electrode bus bars 62n and 66 which will be described below. The negative terminal of the condenser 23 is connected to the negative terminal 24n on the primary side via the negative electrode bus bar 66 and the primary side negative electrode bus bar 61n which will be described later.

The converter 15 switches between turning-on (allowing conduction) and turning-off (interrupting) of each of the transistors 21b based on a gate signal that is a switching command input from the gate drive unit 18 to the gate of the transistor 21b of each phase. The converter 15 boosts the power input from the positive terminal 24p and the negative terminal 24n on the primary side due to power generation of the fuel cell stack 14, and outputs the boosted power from the positive terminal 25p and the negative terminal 25n on the secondary side. The converter 15 accumulates magnetic energy by DC excitation of the composite reactor 22 when each of the transistors 21b is turned on (allowing conduction). The converter 15 generates a higher voltage at the positive terminal 25p and the negative terminal 25n on the secondary side than at the positive terminal 24p and the negative terminal 24n on the primary side due to superposition of an induced voltage generated by the magnetic energy of the composite reactor 22 when each of the transistors 21b is turned off (interrupted) and a voltage applied to the positive terminal 24p and the negative terminal 24n on the primary side.

The electronic control unit 17 controls power conversion such as boosting of the converter 15. For example, the electronic control unit 17 is a software functional part that functions when a predetermined program is executed by a processor such as a central processing unit (CPU). The software functional part is an electronic control unit (ECU) equipped with a processor such as a CPU, a read-only memory (ROM) for storing programs, a random-access memory (RAM) for temporarily storing data, and an electronic circuit such as a timer. At least a part of the electronic control unit 17 may be an integrated circuit such as a large-scale integration (LSI).

For example, the electronic control unit 17 generates a control signal to be input to the gate drive unit 18 using a current target value according to a boosted voltage command when the converter 15 boosts.

The control signal is a signal that indicates a timing of driving each of the transistors 21b of the converter 15 to be turned on (allowing conduction) and off (interrupted).

For example, the electronic control unit 17 drives each of the transistors 21b of the element module 21 for each of two composite reactors 22 by so-called two-phase interleaving. The electronic control unit 17 shifts one cycle of switching control of a first phase transistor 21b and one cycle of switching control of a second phase transistor 21b in the two (two-phase) transistors 21b connected to each of the composite reactors 22 by half a cycle.

The gate drive unit 18 generates a gate signal for actually driving each of the transistors 21b of the converter 15 to be turned on (allowing conduction) and off (interrupted) based on the control signal received from the electronic control unit 17. For example, the gate drive unit 18 performs amplification, level shifting, and the like of the control signal to generate the gate signal. For example, the gate drive unit 18 generates a gate signal having a duty ratio corresponding to a boosted voltage command when the converter 15 boosts. The duty ratio is, for example, the ratio of ON time in each of the transistors 21b.

Figure 3:
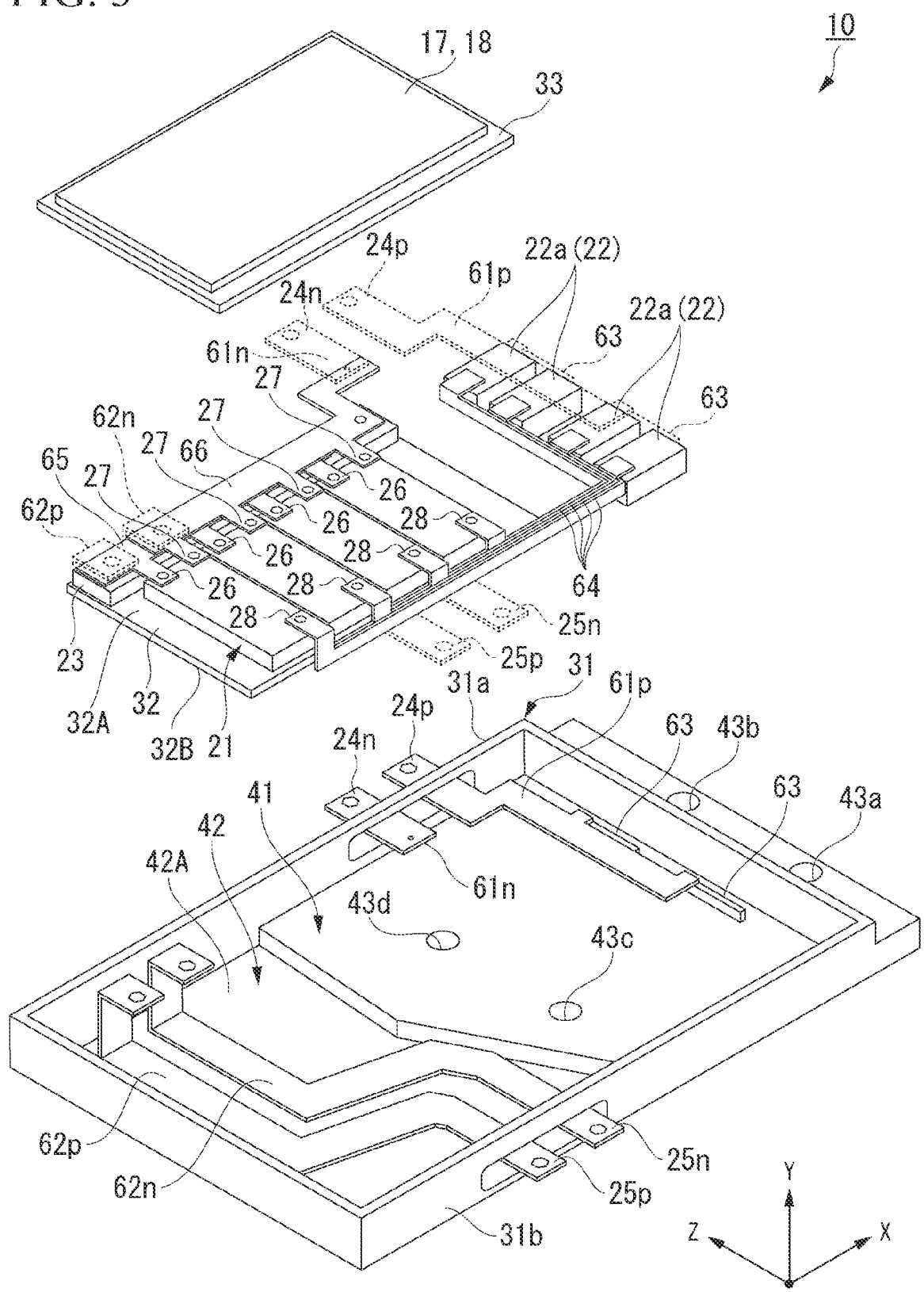
FIG. 3 is an exploded perspective view schematically showing a configuration of the power conversion device according to the embodiment of the present invention.
Figure 4:
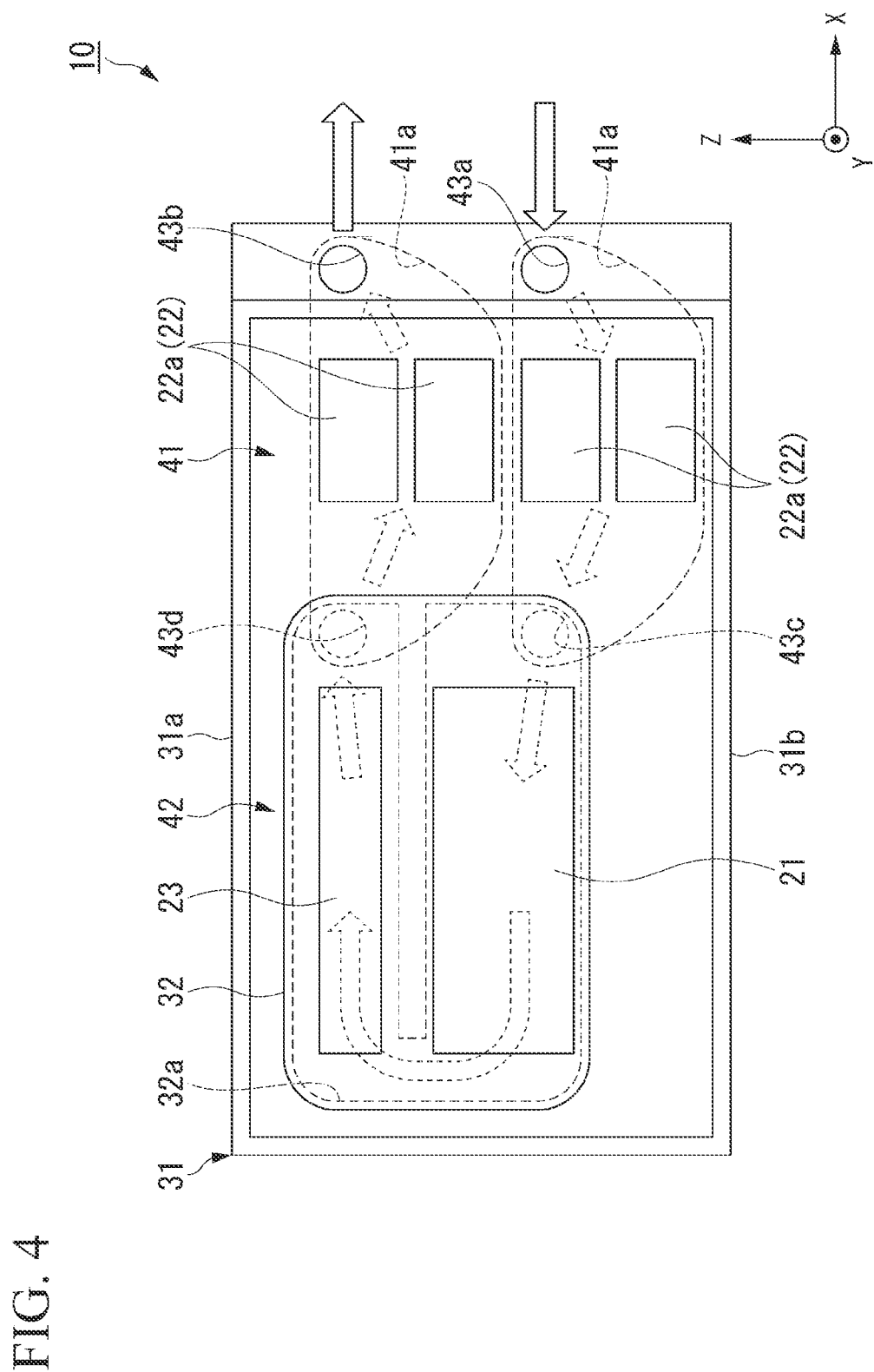
FIG. 4 is a diagram schematically showing the configuration of the power conversion device when seen from a Y-axis direction according to the embodiment of the present invention.
Figure 5:
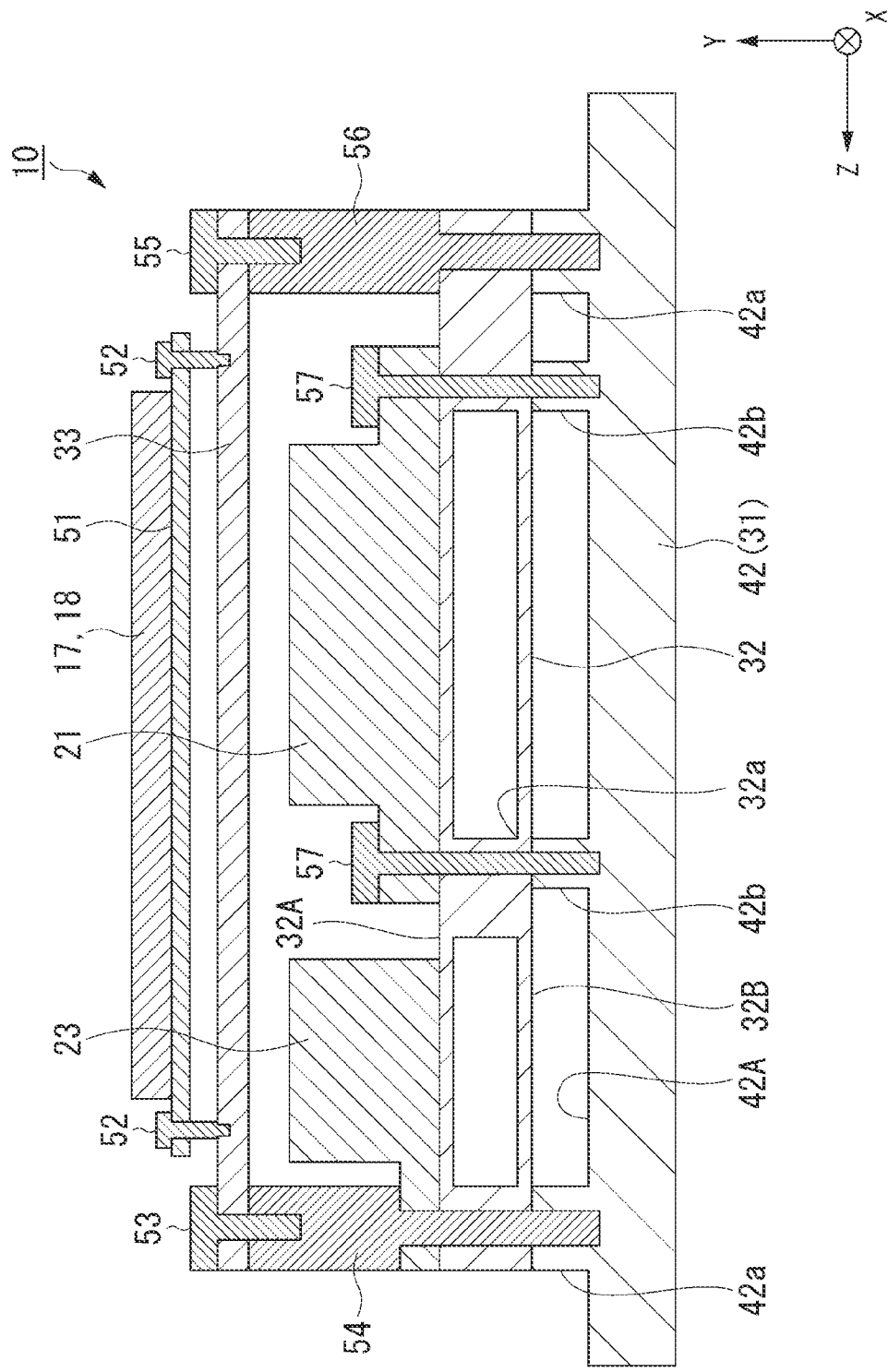
FIG. 5 is a cross-sectional view schematically showing the configuration of the power conversion device when seen from an X-axis direction according to the embodiment of the present invention.

FIG. 3 is an exploded perspective view schematically showing the configuration of the power conversion device 10 according to the embodiment. FIG. 4 is a diagram schematically showing the configuration of the power conversion device 10 according to the embodiment when seen in a Y-axis direction. FIG. 5 is a cross-sectional view schematically showing the configuration of the power conversion device 10 according to the embodiment when seen in an X-axis direction.

In the following description, directions of X, Y, and Z axes that are orthogonal to each other in a three-dimensional space are directions parallel to the respective axes of the vehicle 1. For example, the Z-axis direction is parallel to a vertical direction of the vehicle 1, the Y-axis direction is parallel to the thickness direction of the power conversion device 10, and the X-axis direction is orthogonal to the Z-axis direction and the Y-axis direction.

As shown in FIGS. 3, 4 and 5, the power conversion device 10 includes the converter 15, the electronic control unit 17, the gate drive unit 18, the case 31, the cooler 32, and the support member 33.

An exterior of the case 31 is, for example, a rectangular box shape having a bottom portion at an end in the Y-axis direction (a predetermined direction, a first predetermined direction). The bottom portion of the case 31 includes, for example, a cooling part 41 in which the two composite reactors 22 of the converter 15 are disposed, and a support part 42 that supports the cooler 32 connected to the cooling part 41. The cooling part 41 and the support part 42 are provided side by side in the X-axis direction, for example.

As shown in FIG. 4, for example, a supply port 43a and a discharge port 43b of a coolant are formed at an end of the case 31 on the side of the cooling part 41 in the X-axis direction. The supply port 43a and the discharge port 43b are formed, for example, so as to be arranged with a gap in the Z-axis direction. In the bottom portion of the case 31, the thickness of the cooling part 41 in the Y-axis direction is formed to be greater than the thickness of the support part 42 in the Y-axis direction.

Inside the cooling part 41, two coolant flow paths 41a through which the coolant flows are formed by communicating with the cooler 32 and each of the supply port 43a and the discharge port 43b. The two coolant flow paths 41a are formed, for example, so as to be arranged with a gap in the Z-axis direction.

Two connection ports communicating with the cooler 32 and each of the two coolant flow paths 41a are formed at an end of the cooling part 41 on the side of the support part 42 in the X-axis direction. The two connection ports are a connection port 43c on the supply side of the coolant and a connection port 43d on the discharge side of the coolant, and are formed, for example, so as to be arranged with a gap in the Z-axis direction.

The two composite reactors 22 of the converter 15 are disposed on a surface of the cooling part 41. For example, the two composite reactors 22 are disposed to be arranged with a gap therebetween in the Z-axis direction so as to face the two coolant flow paths 41a in the Y-axis direction. The two-phase coils 22a of the composite reactors 22 are disposed to be arranged with a gap in the Z-axis direction so as to face the respective coolant flow paths 41a in the Y-axis direction.

An exterior of the cooler 32 is, for example, a rectangular plate of which a thickness direction is set in the Y-axis direction. The cooler 32 is, for example, a water jacket. The cooler 32 is disposed to be spaced apart from a surface of the support part 42 of the case 31 in the Y-axis direction. The cooler 32 is connected to the cooling part 41 of the case 31. A coolant flow path 32a that communicates with the two connection ports 43c and 43d of the cooling part 41 of the case 31 is formed inside the cooler 32. An exterior of the coolant flow path 32a as seen in the Y-axis direction is, for example, a U shape. The coolant flow path 32a has a shape that extends from the coolant supply side connection port 43c on the first end side in the X-axis direction toward the second end side in the X-axis direction, curves so as to be folded back on the second end side in the X-axis direction and extends toward the coolant discharge side connection port 43d on the first end side.

The element module 21 and the condenser 23 of the converter 15 are disposed to be arranged with a gap in the Z-axis direction on a surface (a first surface) 32A of both surfaces of the cooler 32 in the Z-axis direction on the side opposite to the side of the support part 42 of the case 31. For example, the condenser 23 is disposed on the side of the first end 31a (the side in a first direction) of both ends of the case 31 in the Z-axis direction, and the element module 21 is disposed on the side of the second end 31b (the side in a second direction) of both ends of the case 31 in the Z-axis direction. For example, in a plan view seen in the Y-axis direction, the condenser 23 is disposed on the side of the first end 31a in the Z-axis direction with respect to the element module 21.

For example, the element module 21 is disposed so as to face the supply side of the coolant flow path 32a in the Y-axis direction (that is, a portion that extends from the coolant supply side connection port 43c on the first end side in the X-axis direction toward the second end side in the X-axis direction). Each of the four phases of the element module 21 is disposed so as to be arranged with a gap in the X-axis direction. For example, the condenser 23 is disposed so as to face the discharge side of the coolant flow path 32a in the Y-axis direction (that is, a portion that extends from the second end side in the X-axis direction toward the coolant discharge side connection port 43d on the first end side). A positive terminal and a negative terminal of the condenser 23 are disposed to be arranged with a gap in the X-axis direction (for example, at both ends in the X-axis direction).

For example, in a plan view seen in the Y-axis direction, a flow direction of the coolant flowing through the coolant flow path 32a of the cooler 32 has a direction (for example, the X-axis direction) that intersects a direction (for example, the Z-axis direction) in which the element modules 21 and the condensers 23 are arranged.

In the cooling part 41 and the cooler 32 of the case 31, first, the coolant that flows from the supply port 43a of the case 31 through the coolant flow path 41a cools one composite reactor 22 (the composite reactor 22 of the two composite reactors 22 disposed on the supply side in Z-axis direction). Next, the coolant that flows from the supply side connection port 43c of the case 31 to the supply side of the coolant flow path 32a of the cooler 32 cools the element module 21 of the converter 15. Next, the coolant that flows through the discharge side of the coolant flow path 32a of the cooler 32 cools the condenser 23 of the converter 15. Next, the coolant that flows from the discharge side connection port 43d of the case 31 through the coolant flow path 41a cools one composite reactor 22 (the composite reactor 22 of the two composite reactors 22 disposed on the discharge side in the Z-axis direction). Then, the coolant in the coolant flow path 32a is discharged to the outside from the discharge port 43b of the case 31.

An exterior of the support member 33 is, for example, a rectangular plate of which a thickness direction is set in the Y-axis direction.

As shown in FIG. 5, the support member 33 supports a substrate 51 (a controller) on which the electronic control unit 17 and the gate drive unit 18 are disposed. An exterior of the substrate 51 is, for example, a rectangular plate of which a thickness direction is set in the Y-axis direction. The substrate 51 is disposed such that a surface of both surfaces in the thickness direction on the side opposite to a surface on which the electronic control unit 17 and the gate drive unit 18 are disposed faces the surface of the support member 33. The substrate 51 is fixed to the support member 33 by a first fastening member 52 such as a stepped screw so as to be stacked with a gap in the Y-axis direction.

The support member 33 is fixed to the support part 42 together with the element module 21 and the condenser 23 of the converter 15, and the cooler 32. The element module 21, the condenser 23, and the cooler 32 are disposed so as to be stacked with a gap in the Y-axis direction with respect to the support member 33 between a surface of the two surfaces in the thickness direction of the support member 33 on the side opposite to a surface to which the substrate 51 is fastened and fixed and the support part 42 of the case 31.

The support member 33 is fastened and fixed to the support part 42 together with the condenser 23 and the cooler 32 by, for example, a second fastening member 53 (a fastening member) and a third fastening member 54 (a fastening member) that are fastened to each other. The support member 33 is fastened and fixed to the third fastening member 54 by the second fastening member 53 such as a bolt. The third fastening member 54 is, for example, a thread conversion joint or an extension joint having male and female threads at both ends in an axial direction. For example, the third fastening member 54 fastens and fixes the condenser 23 and the cooler 32 to a boss 42a that protrudes from the surface of the support part 42 in the Y-axis direction by jointly fastening.

The support member 33 is fastened and fixed to the support part 42 together with the cooler 32 by, for example, a fourth fastening member 55 (a fastening member) and a fifth fastening member 56 (a fastening member) that are fastened to each other. The support member 33 is fastened and fixed to the fifth fastening member 56 by the fourth fastening member 55 such as a bolt. The fifth fastening member 56 is, for example, a thread conversion joint or an extension joint having male and female threads at both ends in the axial direction. The fifth fastening member 56 fastens and fixes the cooler 32 to the boss 42a that protrudes from the surface of the support part 42 in the Y-axis direction.

The element module 21 of the converter 15 and the cooler 32 are fastened and fixed to the boss 42b that protrudes from the surface of the support part 42 in the Y-axis direction by jointly fastening due to a sixth fastening member 57 (a fastening member) such as a bolt.

As shown in FIGS. 2 and 3, the power conversion device 10 includes, for example, the primary side positive electrode bus bar 61p and the primary side negative electrode bus bar 61n, the secondary side positive electrode bus bar 62p and the secondary side negative electrode bus bar 62n, two first bus bars 63, four second bus bars 64, the positive electrode bus bar 65, and the negative electrode bus bar 66. Each of the bus bars 61p, 61n, 62p, 62n, 63, 64, 65, and 66 is, for example, a conductive plate-like member such as a copper plate.

The primary side positive electrode bus bar 61p is connected to the primary side positive terminal 24p and the two first bus bars 63. The primary side negative electrode bus bar 61n is connected to the primary side negative terminal 24n and the negative electrode bus bar 66. The primary side positive terminal 24p connected to the primary side positive electrode bus bar 61p and the primary side negative terminal 24n connected to the primary side negative electrode bus bar 61n are disposed, for example, at a first end 31a of both ends of the case 31 in the Z-axis direction.

The primary side positive electrode bus bar 61p is disposed, for example, with a gap in the Y-axis direction with respect to the two composite reactors 22. The primary side negative electrode bus bar 61n is disposed, for example, between the support member 33 and an end of the negative electrode bus bar 66 connected to the condenser 23 in the Y-axis direction.

The secondary side positive electrode bus bar 62p is connected to the secondary side positive terminal 25p and the positive electrode bus bar 65. The secondary side negative electrode bus bar 62n is connected to the secondary side negative terminal 25n and the negative electrode bus bar 66. The secondary side positive terminal 25p connected to the secondary side positive electrode bus bar 62p and the secondary side negative terminal 25n connected to the secondary side negative electrode bus bar 62n are disposed, for example, at a second end 31b of both ends of the case 31 in the Z-axis direction.

The secondary side positive electrode bus bar 62p and the secondary side negative electrode bus bar 62n are disposed, for example, between the support part 42 of the case 31 and the cooler 32 in the Y-axis direction. The secondary side positive electrode bus bar 62p and the secondary side negative electrode bus bar 62n are respectively disposed along each of a surface (a second surface) 32B of the case 31 on the side of the support part 42 and a surface 42A of the support part 42 of both surfaces of the cooler 32 in the Z-axis direction. The secondary side positive electrode bus bar 62p and the secondary side negative electrode bus bar 62n are disposed to extend from the side of the first end 31a toward the secondary side positive terminal 25p and the secondary side negative terminal 25n of the second end 31b between the first end 31a and the second end 31b of the case 31 in the Z-axis direction. The secondary side positive electrode bus bar 62p and the secondary side negative electrode bus bar 62n extend toward the condenser 23 of the converter 15 so as to bend in the Y-axis direction on the side of the first end 31a. The secondary side positive electrode bus bar 62p and the secondary side negative electrode bus bar 62n are disposed, for example, so as to extend in parallel not to overlap each other in a plan view seen in the Y-axis direction.

Each of the secondary side positive electrode bus bar 62p and the secondary side negative electrode bus bar 62n includes an insulating film that has an electrical insulation property and covers the surface.

The two first bus bars 63 are connected to the primary side positive electrode bus bar 61p and the two composite reactors 22.

The four second bus bars 64 are connected to four coils 22a and four third terminals 28 of the two composite reactors 22.

The positive electrode bus bar 65 is connected to the four-phase first terminal 26, the positive terminal of the condenser 23, and the secondary side positive electrode bus bar 62p. The negative electrode bus bar 66 is connected to the four-phase first terminal 26, the negative terminal of the condenser 23, the primary side negative electrode bus bar 61n, and the secondary side negative electrode bus bar 62n. The positive electrode bus bar 65 and the negative electrode bus bar 66 are, for example, stacked on the condenser 23 in the Y-axis direction and are disposed to extend along the surface of the condenser 23 in the X-axis direction.

For example, at least the positive electrode bus bar 65 of the positive electrode bus bar 65 and the negative electrode bus bar 66, which is sandwiched between the negative electrode bus bar 66 and the condenser 23 in the Y-axis direction, has an insulating film that has an electrical insulation property and covers the surface.

As described above, the power conversion device 10 of the embodiment can prevent lengthening of the connection between the element module 21 and the condenser 23 and can prevent an increase of the parasitic inductance by including the element module 21 and the condenser 23 disposed on the side of the surface (the first surface) 32A of the cooler 32. In addition, compared to a case in which the element module 21 and the condenser 23 are disposed on both sides of the cooler 32 in the thickness direction (the Y-axis direction), for example, an increase in the thickness of the entire device can be prevented.

Due to the secondary side positive electrode bus bar 62p and the secondary side negative electrode bus bar 62n connected between the secondary side positive terminal 25p and the secondary side negative terminal 25n and the condenser 23 being disposed on the side of the surface (the second surface) 32B of the cooler 32, the element module 21, the condenser 23 and the secondary side bus bars 62p and 62n can be efficiently disposed with respect to the cooler 32, for example, compared to a case in which each of the bus bars 62p and 62n is disposed on the side of the surface (the first surface) 32A of the cooler 32.

Due to the condenser 23 being disposed on the side of the first end 31a of the case 31 in the Z-axis direction with respect to the element module 21, the connection between the primary side negative terminal 24n and the condenser 23 disposed at the first end 31a becoming longer can be prevented. Thus, it is possible to prevent lengthening of a current path between the primary side negative terminal 24n and the condenser 23 through which a relatively large current flows.

When seen in the Y-axis direction, since the secondary side positive electrode bus bar 62p and the secondary side negative electrode bus bar 62n do not overlap each other, it is possible to prevent an increase in the thickness of the entire device in the Y-axis direction (the thickness direction).

The third fastening member 54 and the sixth fastening member 57 can fix the element module 21, the condenser 23 and the cooler 32 to the case 31 by so-called jointly fastening, and thus the element module 21, the condenser 23, and the cooler 32 can be disposed more efficiently than a case in which they are individually fixed by fastening members.

The second fastening member 53 and the third fastening member 54, and the fourth fastening member 55 and the fifth fastening member 56 can fix the support member 33 to which the electronic control unit 17 and the gate drive unit 18 are fixed, and the cooler 32 to the case 31 by jointly fastening, and thus each of the units 17 and 18 and the cooler 32 can be disposed more efficiently than a case in which they are individually fixed by fastening members. Moreover, a space for arranging the element module 21 and the condenser 23 can be secured between the support member 33 and the cooler 32, and the arrangement efficiency of the entire device can be improved.

In the coolant flow path 32a of the cooler 32, the coolant flows in a direction (for example, the X-axis direction) intersecting the direction (for example, the Z-axis direction) in which the element module 21 and the condenser 23 are arranged, and thus the element module 21 and the condenser 23 can be cooled in series. Thus, the coolant flow path 32a can be provided efficiently, and the cooling can be efficiently performed with appropriate settings corresponding to each of the element module 21 and the condenser 23.

Modified Examples

Modified examples of the embodiment will be described below. The same parts as those of the above-described embodiment are designated by the same reference numerals, and descriptions thereof will be omitted or simplified.

In the above-described embodiment, although the substrate 51 is fixed to the support member 33 by the first fastening member 52 such as a stepped screw so as to be stacked with a gap in the Y-axis direction, the present invention is not limited thereto. For example, the substrate 51 may be fastened and fixed with a screw or the like so as to be in contact with the support member 33 in the Y-axis direction. Further, for example, the substrate 51 and the support member 33 may be configured integrally.

In the above-described embodiment, although each of the third fastening member 54 and the fifth fastening member 56 is, for example, a thread conversion joint, an extension joint, or the like, the present invention is not limited thereto. For example, at least one of the third fastening member 54 and the fifth fastening member 56 may be a fastening member, for example, a stepped bolt or the like which fastens and fixes the support member 33 and the condenser 23 or the cooler 32 to the case 31 while a predetermined gap is provided therebetween in the Y-axis direction. The predetermined gap in the Y-axis direction is, for example, a gap required to arrange the element module 21 and the condenser 23 between the support member 33 and the cooler 32.

In the above-described embodiment, although the third fastening member 54 fastens and fixes both the condenser 23 and the cooler 32 to the case 31, and the sixth fastening member 57 fastens and fixes both the element module 21 and the cooler 32 to the case 31, the present invention is limited thereto. For example, a fastening member for fastening and fixing the cooler 32 and at least one of the element module 21 and the condenser 23 together to the case 31 may be provided.

In the above-described embodiment, the power conversion device 10 is mounted in the vehicle 1, but is not limited thereto and may be mounted in other equipment.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A power conversion device that comprises:
a switching element;
a condenser connected to the switching element; and
a cooler configured to cool at least one of the switching element and the condenser, the power conversion device comprising:
a case configured to accommodate the switching element and the condenser;
a plurality of terminals for power input and output that are provided on the case; and
a conductive member connected between and electrically connecting a predetermined terminal of the plurality of terminals and the condenser,
wherein the switching element and the condenser are disposed on a first surface side of the cooler,
wherein the conductive member is disposed on a second surface side of the cooler opposite the first surface side,
wherein the conductive member is bent to form an accommodating space to wrap around the condenser and the cooler, and
wherein the conductive member comprises a first portion that is in contact with the condenser on the first surface side of the cooler and a second portion that is provided on the second surface side of the cooler.

2. The power conversion device according to claim 1, wherein:
the plurality of terminals include a first terminal and a second terminal; and
in a plan view seen from a first predetermined direction of the case,
the first terminal is disposed on a portion of the case at a first direction side in a second predetermined direction,
the second terminal which is the predetermined terminal is disposed on a portion of the case at a second direction side in the second predetermined direction, and
the condenser is disposed on the first direction side of the switching element in the second predetermined direction.

3. The power conversion device according to claim 1, wherein:
the conductive member includes a positive electrode conductive member and a negative electrode conductive member; and
in a plan view seen from a predetermined direction of the case,
the positive electrode conductive member and the negative electrode conductive member are disposed so as to extend toward the predetermined terminal without overlapping each other at the second surface side of the cooler.

4. The power conversion device according to claim 1, comprising:
a fastening member configured to fasten and fix at least one of the condenser and a module having the switching element, and the cooler together.

5. The power conversion device according to claim 1, comprising:
a controller configured to control an operation of the switching element; and
a fastening member configured to fasten and fix the controller and the cooler together while providing a space by which at least one of the condenser and a module having the switching element is arranged between the controller and the cooler.

6. The power conversion device according to claim 1, wherein, in a plan view seen from a predetermined direction of the case, a flow direction of a coolant flowing through a flow path formed in the cooler has a direction that intersects a direction in which the switching element and the condenser are aligned.

7. The power conversion device according to claim 1, wherein the conductive member extends along a second surface of the cooler in a state where a surface of the conductive member faces the second surface of the cooler.

* * * * *